US008383298B2

(12) United States Patent
Sakurai et al.

(10) Patent No.: US 8,383,298 B2
(45) Date of Patent: Feb. 26, 2013

(54) SUBSTRATE PROCESSING METHOD, MANUFACTURING METHOD OF EUV MASK, AND EUV MASK

(75) Inventors: Hideaki Sakurai, Kanagawa (JP); Masatoshi Terayama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 13/034,143

(22) Filed: Feb. 24, 2011

(65) Prior Publication Data
US 2011/0207031 A1  Aug. 25, 2011

(30) Foreign Application Priority Data

Feb. 25, 2010  (JP) .................................. 2010-040500

(51) Int. Cl.
*G03F 1/50* (2012.01)
*G03F 1/60* (2012.01)

(52) U.S. Cl. ............................................. 430/5; 430/30
(58) Field of Classification Search ................ 430/5, 30; 428/428, 430
See application file for complete search history.

(56) References Cited

U.S. PATENT DOCUMENTS
5,928,840 A * 7/1999 Matsuo et al. ................ 430/324

FOREIGN PATENT DOCUMENTS
JP  2005-57165  3/2005

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

According to the substrate processing method in the embodiments, as a mask substrate used for forming an EUV mask, a mask substrate in which a first film having a first hydrophilicity is formed on one main surface and a resist is applied to another main surface is exposed from a side of the resist. Then, a hydrophilic treatment is performed on a surface of the first film to make the surface of the first film have a second hydrophilicity larger than the first hydrophilicity. Then, a development treatment of the resist is performed with respect to the mask substrate in which the hydrophilic treatment is performed on the surface of the first film to have the second hydrophilicity.

20 Claims, 5 Drawing Sheets

FIG.1A
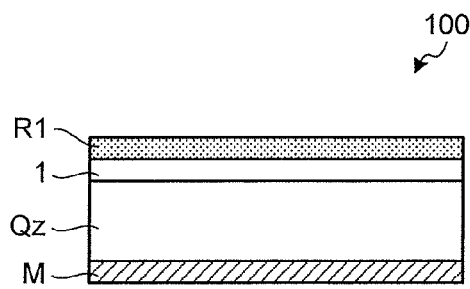
FIG.1B
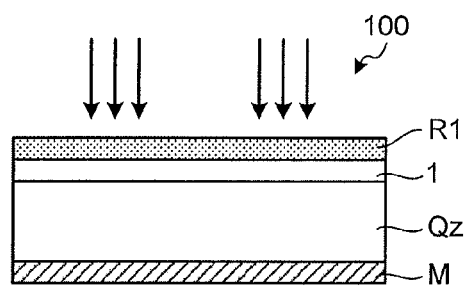
FIG.1C
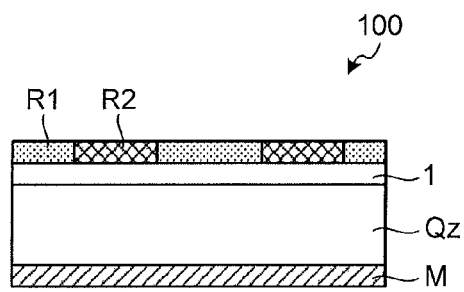
FIG.1D
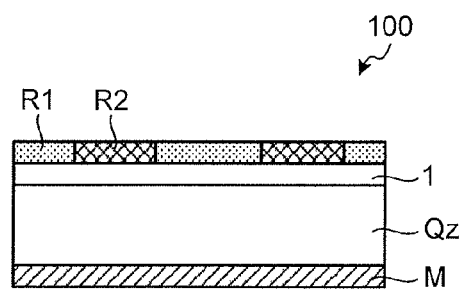
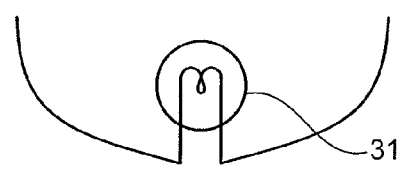
FIG.1E
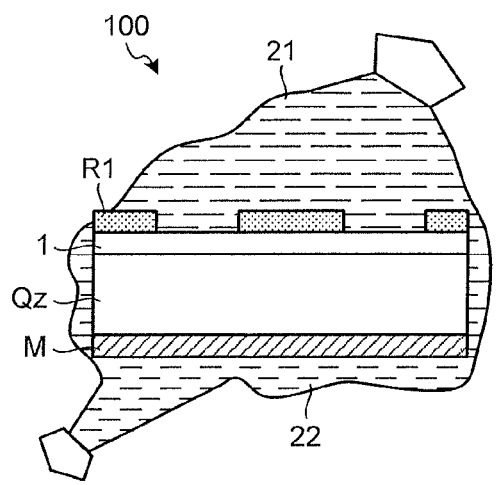
FIG.1F
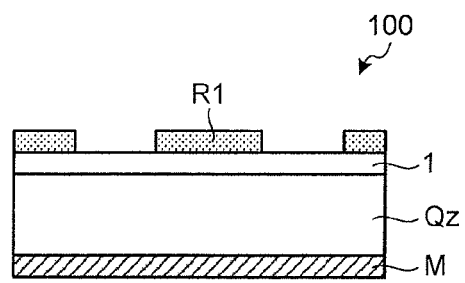

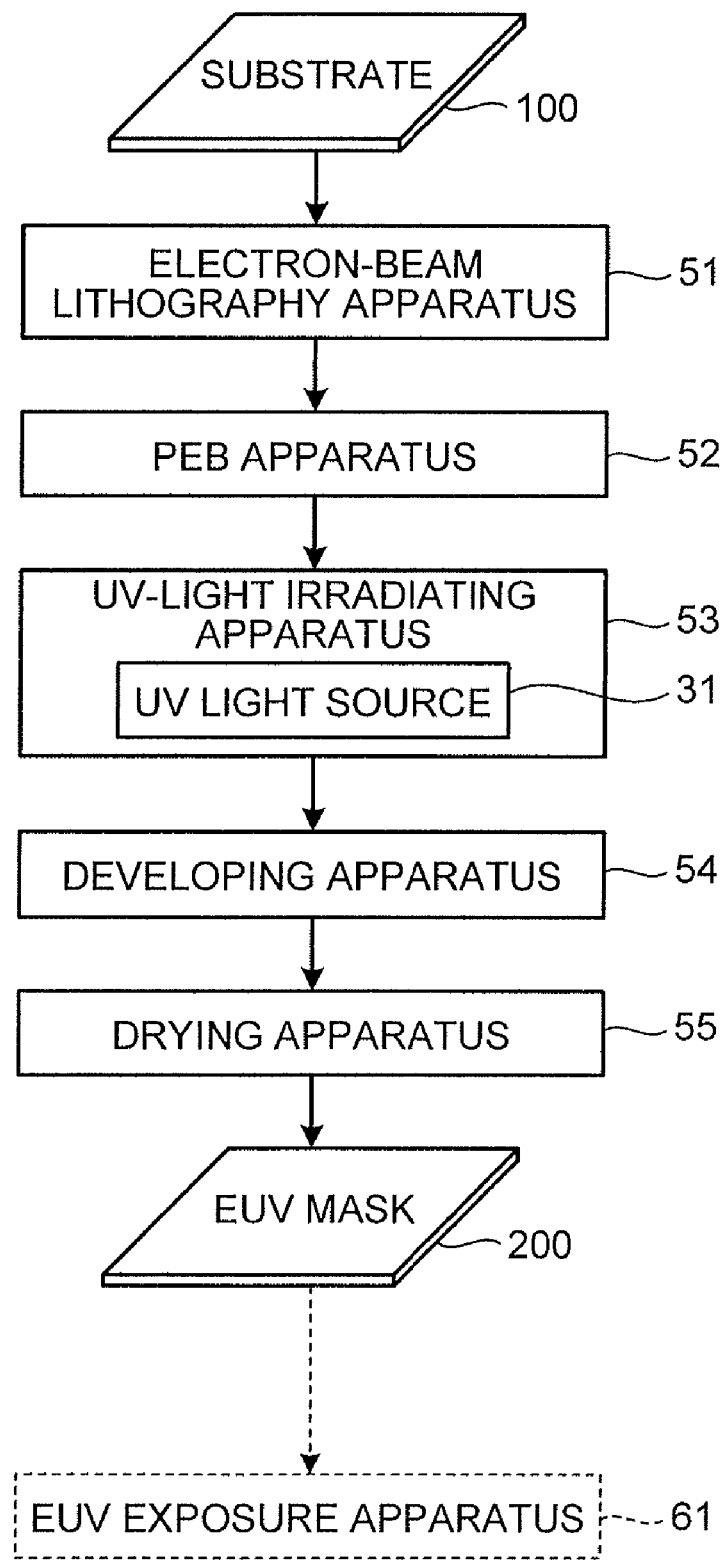

FIG.5A
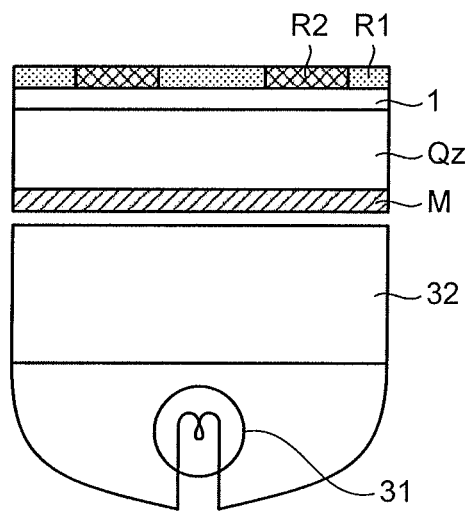
FIG.5B
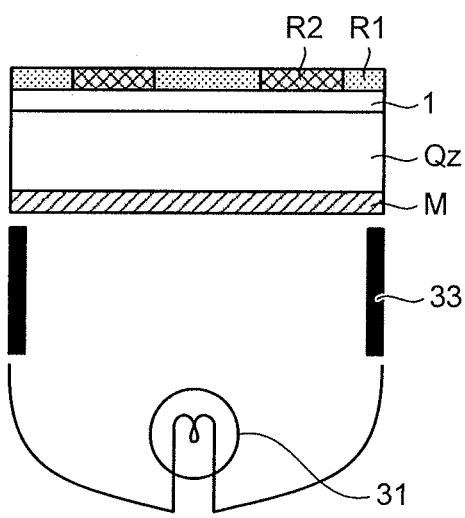
FIG.5C
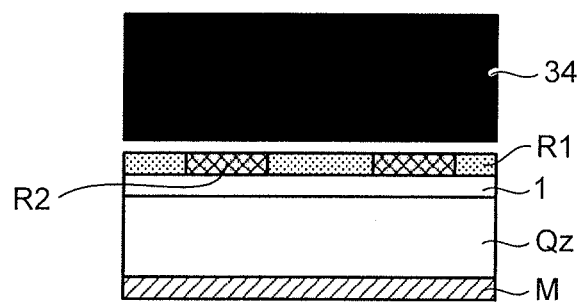
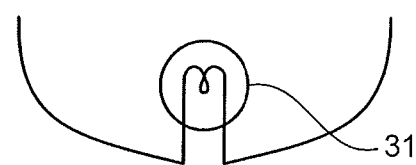

FIG.6A
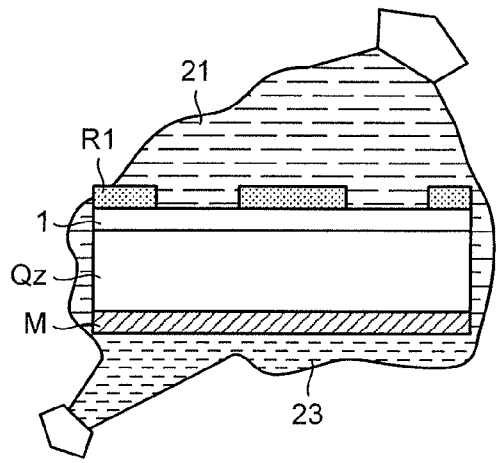
FIG.6B
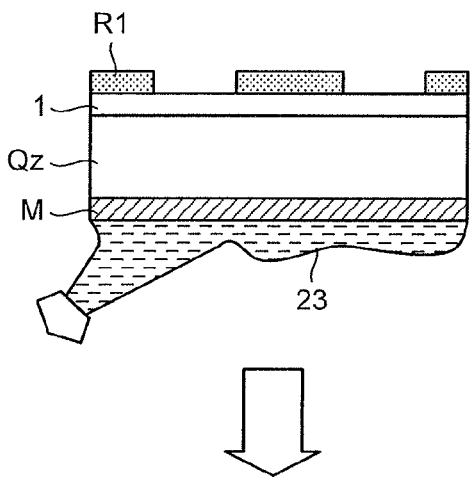
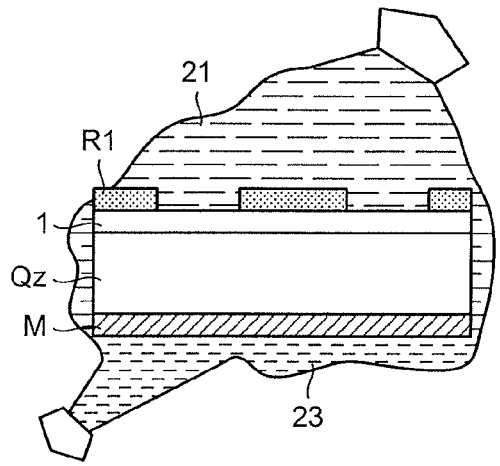

SUBSTRATE PROCESSING METHOD, MANUFACTURING METHOD OF EUV MASK, AND EUV MASK

CROSS-REFERENCE TO RELATED APPLICATIONS

This application is based upon and claims the benefit of priority from the prior Japanese Patent Application No. 2010-40500, filed on Feb. 25, 2010; the entire contents of which are incorporated herein by reference.

FIELD

The present embodiments typically relate to a substrate processing method, a manufacturing method of an EUV mask, and an EUV mask.

BACKGROUND

Conventionally, a transmissive mask whose back surface is composed of glass (Qz) has been used as a photomask. Organic matter is difficult to adhere to Qz due to its surface condition, so that adhesion of particles to the back surface does not substantially arise as a problem. On the other hand, an EUV mask (EUV exposure mask) is a reflective mask, so that an exposure process needs to be performed in a state where the EUV mask is electrostatically chucked. Therefore, a conductive film is formed on the back surface of the EUV mask. For the conductive film, a material, to which organic particles are easy to adhere, is often used, and adhered organic particles are difficult to clean in a cleaning process thereafter. If organic particles are adhered to the conductive film, the EUV mask distorts when the back surface of the EUV mask is electrostatically chucked, so that a dimension or a position of an exposed wafer pattern is misaligned from a desired value.

Moreover, when manufacturing the EUV mask, if a film is attached to the back surface of the EUV mask, poor drying (droplet residue) occurs after a development treatment. Then, impurities including carbon in the air adhere to liquid remaining on the back surface, which results in contaminating the back surface of the EUV mask. Therefore, a countermeasure is needed against contamination (particles or droplet residue defects) of not only the front surface but also the back surface in the EUV mask.

BRIEF DESCRIPTION OF THE DRAWINGS

FIG. 1A to FIG. 1F are diagrams illustrating a manufacturing procedure of an EUV mask according to a first embodiment;

FIG. 2 is a diagram illustrating a configuration of a manufacturing system of the EUV mask;

FIG. 5A to FIG. 5C are diagrams for explaining specific examples of an UV irradiating method; and FIG. 6A and FIG. 6B are diagrams illustrating a hydrophilic treatment procedure by an oxidizing liquid to a substrate.

DETAILED DESCRIPTION

Figure 3:
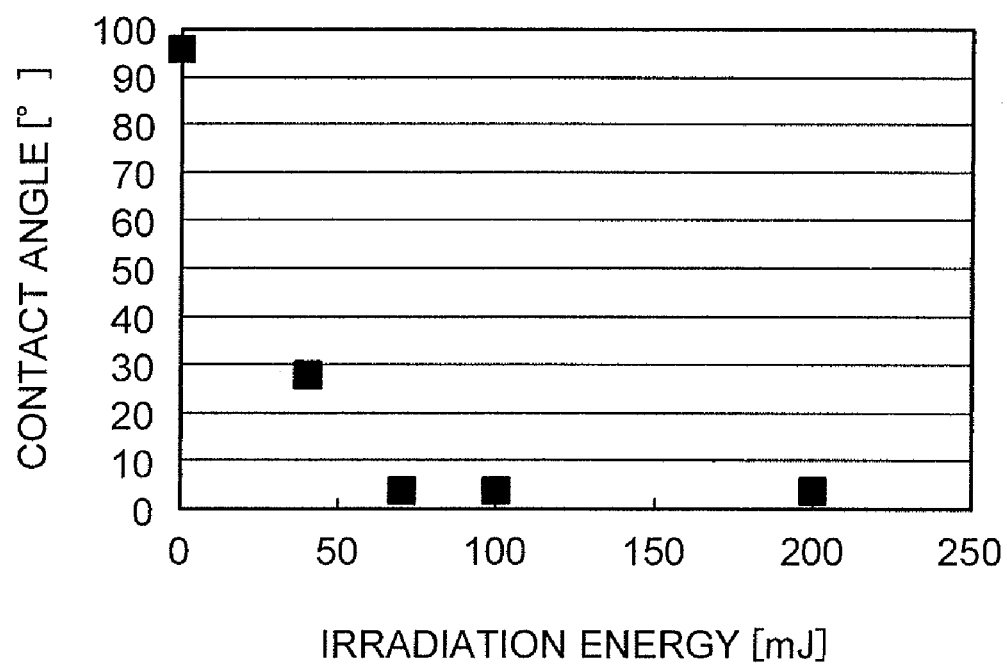
FIG. 3 is a diagram illustrating a relationship between an irradiation energy of UV light to a conductive film and a contact angle of the conductive film.

According to a substrate processing method in embodiments, as a mask substrate used for forming an EUV mask, a mask substrate in which a first film having a first hydrophilicity is formed on one main surface and a resist is applied to another main surface is exposed from a side of the resist. Then, a hydrophilic treatment is performed on a surface of the first film to make the surface of the first film have a second hydrophilicity larger than the first hydrophilicity. Then, a development treatment of the resist is performed with respect to the mask substrate in which the hydrophilic treatment is performed on the surface of the first film to have the second hydrophilicity.

A substrate processing method, a manufacturing method of an EUV mask, and an EUV mask according to the embodiments will be explained below in detail with reference to the accompanying drawings. The present invention is not limited to these embodiments.

(First Embodiment)

A substrate processing method according to the present embodiment is, for example, used in a pattern formation in a semiconductor manufacturing process (wafer process, exposure mask manufacturing process, and the like) or a liquid-crystal-device manufacturing process. In the following, the case is explained in which the substrate processing method is applied to a manufacturing process of an EUV mask used in EUV (Extreme Ultra-Violet) lithography.

FIG. 1A to FIG. 1F are diagrams illustrating the manufacturing procedure of the EUV mask according to the first embodiment, and FIG. 2 is a diagram illustrating a configuration of a manufacturing system of the EUV mask. When manufacturing an EUV (Extreme Ultra-Violet) mask 200, an EUV mask blank (EUV exposure mask blank) is manufactured in advance. In the following, the EUV mask blank on which a resist R1 to be described later is formed is called a substrate (mask substrate) 100.

The manufacturing system of the EUV mask includes an electron-beam lithography apparatus 51, a PEB apparatus 52, an UV-light irradiating apparatus (UV irradiating unit) 53, a developing apparatus (developing treatment unit) 54, and a drying apparatus 55. The electron-beam lithography apparatus 51 is an apparatus that irradiates the substrate 100 with exposure light by EB (electron beam). The PEB apparatus 52 is an apparatus that heats (PEB: Post Exposure Baking) the exposed substrate 100, and the developing apparatus 54 is an apparatus that performs development on the substrate 100. The UV-light irradiating apparatus 53 is an apparatus that performs hydrophilization on the substrate 100 and includes a UV light source 31 that irradiates the back surface of the substrate 100 with UV light. The drying apparatus 55 is an apparatus that dries the substrate 100 after development. The substrate 100 to which the resist R1 is applied is conveyed to each apparatus in the order of the electron-beam lithography apparatus 51, the PEB apparatus 52, the UV-light irradiating apparatus 53, the developing apparatus 54, and the drying apparatus 55 to be processed in each apparatus.

The EUV mask blank (the substrate 100 before the resist R1 is applied) is configured to include a glass substrate Qz having a low thermal expansion property, and a conductive film (back surface film) M is formed on the back surface side (lower surface) of the glass substrate Qz. Moreover, a light-shielding film (not shown) and a reflective film 1 are formed on the front surface side (upper surface) of the glass substrate Qz.

The surface on the front side of the EUV mask blank is a surface on a side that is irradiated with EUV light when performing an EUV exposure by using the EUV mask. The reflective film 1 is a film that is irradiated with the EUV light and reflects the EUV light onto the wafer side when performing the EUV exposure.

Moreover, the surface on the back side of the EUV mask blank is a surface on a side that is electrostatically chucked when performing the EUV exposure by using the EUV mask. The conductive film M is electrostatically chucked by an EUV exposure apparatus 61 to be described later when performing the EUV exposure. The conductive film M is a film that includes metal such as chrome (Cr) and is a film whose hydrophilicity is not high.

As shown in FIG. 1A, for manufacturing the EUV mask 200, for example, the positive-type chemically-amplified resist R1 is formed on the upper surface side of the reflective film 1 in advance. Consequently, in the substrate 100 used for manufacturing the EUV mask 200, a processing target film including a photosensitive thin film is formed on the front surface and a thin film having conductivity is formed on the back surface in advance.

After forming the resist R1 on the upper surface side of the reflective film 1, as shown in FIG. 1B, exposure light such as EB is emitted from above the resist R1 by the electron-beam lithography apparatus 51 to a position corresponding to a formation position of a mask pattern. Consequently, exposure to the resist R1 is performed and a latent image is formed at the position corresponding to the formation position of the mask pattern in the resist R1.

Then, as shown in FIG. 1C, heating (PEB) of the substrate 100 is performed by the PEB apparatus 52. Consequently, a sensitizer of the resist R1 is diffused. A portion (position at which the mask pattern is formed) that is not irradiated with exposure light in the resist R1 is dissolved sparingly in a developer. On the other hand, a portion (position at which the mask pattern is not formed) that is irradiated with exposure light is dissolved in a developer. In FIG. 1C, a resist region insolubilized to a developer is illustrated as the resist R1 and a resist region that is not insolubilized to a developer is illustrated as a resist R2.

Thereafter, as shown in FIG. 1D, the conductive film M that is the back surface side of the substrate 100 is irradiated with UV light from the UV light source 31 of the UV-light irradiating apparatus 53 as one of the substrate processes. In other words, the back surface side of the substrate 100 is irradiated with UV light before the development treatment is started after the PEB treatment. Consequently, ozone ($O_3$) is generated. Then, the generated ozone oxidizes the surface of the conductive film M and, as a result, the hydrophilicity of the surface of the conductive film M increases. When irradiating the conductive film M with UV light, a configuration and a process condition are selected so that a pattern dimension or a defect on the surface of the substrate 100 is not affected.

After the hydrophilicity of the conductive film M is increased by the UV light irradiation, the substrate 100 is immediately conveyed to the developing apparatus 54. Then, as shown in FIG. 1E, the development treatment of the substrate 100 is performed in the developing apparatus 54. Specifically, a developer 21 is supplied (dropped or sprayed) from the front surface side of the substrate 100 to the whole front surface of the substrate 100. Consequently, the resist R2 is removed from the substrate 100 and the resist R1 remains on the substrate 100, whereby a resist pattern is formed on the substrate 100. Moreover, as a back surface rinsing treatment, a rinse liquid 22 such as pure water is applied from the back surface side of the substrate 100 to the whole back surface of the substrate 100. Consequently, the back surface of the substrate 100 is rinsed.

In the present embodiment, because the hydrophilic treatment is performed on the conductive film M, even if the developer 21 flows around to the conductive film M side in the development treatment to the substrate 100, the developer 21 hardly remains on the conductive film M by performing the rinsing treatment. Moreover, after the rinse liquid 22 is applied to the substrate 100, the rinse liquid 22 hardly remains on the conductive film M.

It is desirable to pre-wet the substrate 100 with liquid such as pure water that does not react with the substrate 100 before developing the resist R1 applied to the front surface of the substrate 100 for making a treatment temperature of the substrate 100 constant. When the temperature change of the substrate 100 by the UV irradiation is small, pre-wetting of the substrate 100 can be omitted.

Moreover, if a long period of time elapses after the UV irradiation, carbon contaminant in an ambient atmosphere of the substrate 100 occurs on the back surface of the substrate 100 and whereby the hydrophilic effect decreases over time. Therefore, it is desirable to start the development treatment of the substrate 100 within five minutes.

Thereafter, as shown in FIG. 1F, drying of the substrate 100 is performed by the drying apparatus 55. The drying apparatus 55 performs drying of the substrate 100 while rotating the substrate 100 in a plane parallel to the main surface. Then, the reflective film 1 is etched from above the resist R1, and thereafter the resist R1 is removed, whereby the EUV mask 200 is completed. After the EUV mask 200 is completed, the EUV mask 200 is conveyed to the EUV exposure apparatus 61 and the EUV exposure treatment is performed on a wafer.

In this manner, in the present embodiment, before developing the substrate 100 in which the conductive film M (first film) having a first hydrophilicity is formed on one main surface and the resist R1 is applied to the other main surface, the hydrophilic treatment is performed on the surface of the conductive film M by oxidizing the surface of the conductive film M. Consequently, the surface of the conductive film M is hydrophilized to have a second hydrophilicity larger than the first hydrophilicity. Then, after performing the hydrophilic treatment on the conductive film M, the development treatment is performed on the substrate 100.

In other words, in the present embodiment, before (for example, immediately before) performing the development treatment (back surface rinsing and drying) that is the first liquid treatment to the substrate 100, hydrophilization of the conductive film M is performed. Therefore, it is possible to prevent adhesion of particles to the conductive film M in the development treatment to the substrate 100, generation of a droplet residue defect when drying the substrate 100, and the like. Thus, contamination of the conductive film M can be prevented.

The hydrophilic treatment of the conductive film M can be performed before any process so long as it is the first liquid treatment to the substrate 100. When it takes a predetermined period of time or more from the hydrophilic treatment of the conductive film M to the development process to the substrate 100, the ambient atmosphere of the substrate 100 is controlled until the development process so that the hydrophilicity of the conductive film M is not deteriorated.

Figure 4:
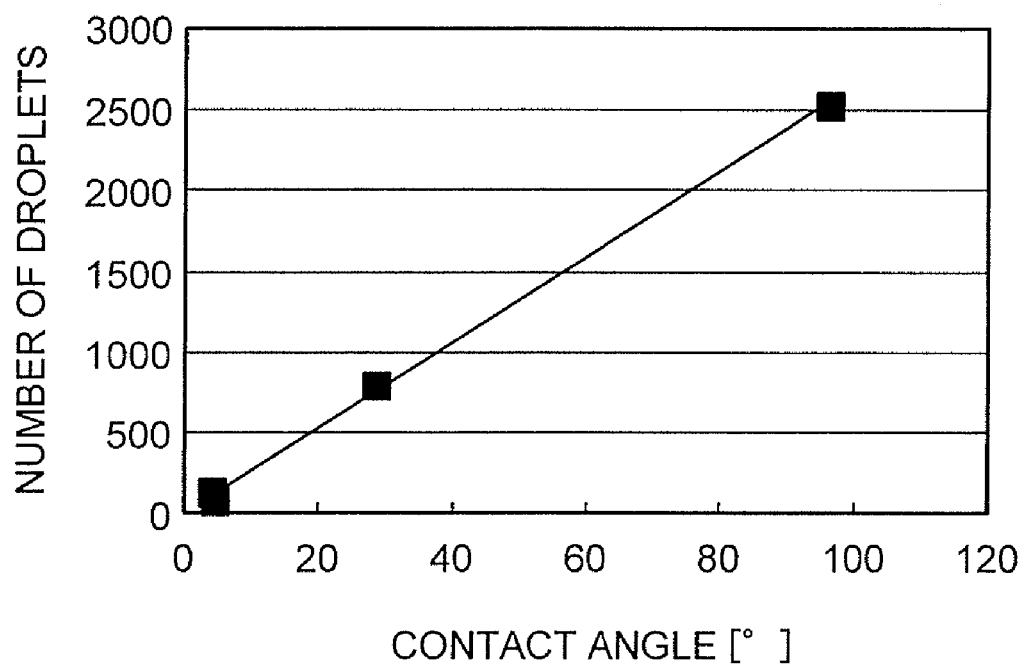
FIG. 4 is a diagram illustrating a relationship between the contact angle of the conductive film and a droplet residue on the conductive film.

Explanation is given for a relationship between an irradiation energy of UV light to the conductive film M and a contact angle of the conductive film M and a relationship between the contact angle of the conductive film M and the droplet residue on the conductive film M. FIG. 3 is a diagram illustrating the relationship between the irradiation energy of UV light to the conductive film and the contact angle of the conductive film. FIG. 4 is a diagram illustrating the relationship between the contact angle of the conductive film and the droplet residue on the conductive film. In FIG. 3, a horizontal axis indicates the irradiation energy of UV light to the conductive film M and a vertical axis indicates the contact angle of the conductive film M. Moreover, in FIG. 4, a horizontal axis indicates the contact angle of the conductive film M and a vertical axis indicates the remaining number of droplets (the number of droplets) on the conductive film M. The relationship shown in FIG. 4 is $y=26.587x-1.7197$ and $R^2=0.9988$.

The contact angle of the conductive film M is an angle that a droplet (for example, the rinse liquid 22) on the conductive film M forms with respect to the film surface of the conductive film M, and the contact angle becomes smaller as the hydrophilicity becomes higher. As shown in FIG. 3, it is found that when the conductive film M is irradiated with UV light with the irradiation energy of about 100 mJ, the contact angle takes approximately a constant value of 5° or less. Moreover, as shown in FIG. 4, when the contact angle is 5° or less, the number of droplets becomes small (50 or less). Therefore, the number of droplet residue defects can be reduced by performing the UV irradiation to the conductive film M for a treatment time with which the contact angle becomes about 5° or less with margin.

For example, an allowable value of the number of droplets is preset. Then, the contact angle with which this allowable value can be satisfied is derived based on the relationship shown in FIG. 4. Moreover, the irradiation energy with which the contact angle calculated based on the relationship shown in FIG. 4 can be ensured is derived based on the relationship shown in FIG. 3. Consequently, the number of droplet residue defects can be reduced to a desired value (allowable value) or less.

Next, specific examples of the UV irradiating method are explained. FIG. 5A to FIG. 5C are diagrams for explaining the specific examples of the UV irradiating method. When performing the UV irradiation from the back surface side of the substrate 100, it is desirable that the UV irradiation is performed so that UV light does not reach the resists R1 and R2 on the front surface of the substrate 100. Therefore, for example, as shown in FIG. 5A, a light guide 32 for preventing diffusion of UV light is arranged between the UV light source 31 and the conductive film M in the UV-light irradiating apparatus 53. The light guide 32 has a tubular shape (that includes cylindrical shape and prismatic shape) to cover the gap between the UV light source 31 and the conductive film M. Moreover, the light guide 32 is, for example, formed of a material whose absorption in a UV light wavelength region is small, a material (low thermal expansion vitreous silica) that has a low thermal expansion property even if it has a slight absorption, or the like. Consequently, UV light emitted from the UV light source 31 is prevented from reaching the resists R1 and R2. Moreover, the irradiation amount of UV light emitted to the back surface of the conductive film M becomes uniform in the plane of the conductive film M.

Moreover, as shown in FIG. 5B, it is applicable to arrange a UV shielding plate 33 for preventing diffusion of UV light between the UV light source 31 and the conductive film M in the UV-light irradiating apparatus 53. The UV shielding plate 33 has a tubular shape to cover the gap between the UV light source 31 and the conductive film M. Moreover, the UV shielding plate 33 is formed of a member that can prevent leakage of UV light. Consequently, UV light emitted from the UV light source 31 or ozone generated by UV light can be prevented from reaching the resists R1 and R2.

Furthermore, as shown in FIG. 5C, it is applicable to arrange a cover member 34 (for example, plate-shaped structure) that covers the surfaces of the resists R1 and R2 on the upper surface side of the substrate 100 in the UV-light irradiating apparatus 53. The cover member 34 is arranged to be parallel to the main surface of the substrate 100 and in close proximity to the front surface of the substrate 100. Consequently, UV light emitted from the UV light source 31 can be prevented from reaching the resists R1 and R2.

Moreover, the UV light source 31 can be divided and arranged. For example, a plurality of the UV light sources 31 is arranged in the UV-light irradiating apparatus 53 and the conductive film M is irradiated with UV light by using the UV light sources 31. Consequently, the irradiation amount of UV light emitted to the back surface of the conductive film M becomes uniform in the plane of the conductive film M.

Furthermore, the UV irradiation to the substrate 100 can be performed by combining the above UV irradiating methods. It is applicable to directly irradiate the conductive film M with UV light from the UV light source 31 without using the above UV irradiating methods.

After the EUV mask 200 is completed, a semiconductor device (semiconductor integrated circuit) is manufactured by using the EUV mask 200 in the wafer process. Specifically, the EUV exposure apparatus 61 performs the exposure treatment on the wafer by using the EUV mask 200, and thereafter the development treatment and the etching treatment to the wafer are performed. In other words, a mask material is processed with a resist pattern formed by transfer in the lithography process, and further, a processing target film is patterned by etching by using the patterned mask material. The EUV mask 200 is manufactured for each layer when manufacturing a semiconductor device. Then, when manufacturing a semiconductor device, the exposure treatment, the development treatment, and the etching treatment are performed on the wafer for each layer by using the EUV mask 200 manufactured for each layer.

In the present embodiment, the case is explained in which the manufacturing system of the EUV mask includes the PEB apparatus 52, the UV-light irradiating apparatus 53, the developing apparatus 54, and the drying apparatus 55; however, theses apparatuses can be separate apparatuses or the configuration can be such that the apparatuses are included in one apparatus.

As above, according to the first embodiment, the conductive film M is hydrophilized before the development treatment process, so that contamination of the back surface of the EUV mask 200 when manufacturing the EUV mask 200 can be prevented. Moreover, the contact angle of the conductive film M is set to 5° or less, the number of droplet residue defects can be reduced. Consequently, TAT for a back surface inspection of the EUV mask 200 performed after the development process can be shortened. Moreover, because the number of droplet residue defects is reduced, it becomes easy to perform a review of particles that would otherwise have to be removed, or the like. Therefore, it also becomes easy to remove (clean or correct) particles adhered to the conductive film M. Thus, the production cost of the EUV mask 200 can be reduced and the throughput can be improved.

Moreover, because the hydrophilic treatment to the conductive film M is performed immediately before the development process, development of the substrate 100 can be performed before the hydrophilicity of the conductive film M is deteriorated. Thus, contamination of the back surface of the EUV mask can be efficiently prevented.

Furthermore, the light guide 32, the UV shielding plate 33, the cover member 34, or the like is arranged in the UV-light irradiating apparatus 53, so that the particle adhesion and the droplet residue on the front surface side of the substrate 100 can be efficiently prevented.

(Second Embodiment)

Next, the second embodiment of this invention is explained with reference to FIG. 6A and FIG. 6B. In the second embodiment, before performing the development treatment on the substrate 100, the conductive film M is hydrophilized in advance by using liquid (oxidizing liquid 23 to be described later) having an oxidation effect instead of the UV irradiation.

In the similar manner to the first embodiment, the light shielding film and the reflective film 1 are formed on the front surface of the mask blank. Moreover, the conductive film M is formed on the back surface of the mask blank. When manufacturing the EUV mask 200, the substrate 100 in which the resist R1 is applied to the upper surface side of the reflective film 1 is exposed by the electron-beam lithography apparatus 51, and thereafter the PEB is performed on the substrate 100 to form a latent image in the resist R1.

In the present embodiment, the hydrophilic treatment (back surface treatment) is performed only on the back surface side (the conductive film M) of the substrate 100 with the oxidizing liquid 23 having oxidizability before starting the drying process in the development treatment on the substrate 100 after the PEB treatment.

FIG. 6A and FIG. 6B are diagrams illustrating a manufacturing procedure of the EUV mask according to the second embodiment and illustrate a hydrophilic treatment procedure by an oxidizing liquid to the substrate. FIG. 6A and FIG. 6B illustrate the order of the back surface treatment and the development to the substrate 100 as the hydrophilic treatment procedure to the substrate 100.

For example, as shown in FIG. 6A, the development (supply of the developer 21) of the substrate 100 and the back surface treatment (supply of the oxidizing liquid 23) to the substrate 100 are performed simultaneously. At this time, for enabling to fill the back surface of the substrate 100 with the oxidizing liquid 23 by the back surface treatment before the developer 21 flows around to the back surface of the substrate 100, it is applicable to adjust a development start timing or a start timing of the back surface treatment, an application amount of the developer 21 or the oxidizing liquid 23, or the like.

Moreover, as shown in FIG. 6B, development to the substrate 100 can be performed after performing the back surface treatment on the substrate 100. In this case, after filling the back surface of the substrate 100 with the oxidizing liquid 23 as the back surface treatment to the substrate 100, the development treatment of the substrate 100 and the back surface rinsing of the substrate 100 are performed. The back surface rinsing of the substrate 100 can be performed by the oxidizing liquid 23 or can be performed by the rinse liquid 22 such as pure water.

In the development treatment of the substrate 100, the developer flows around to the back surface and the back surface rinsing is performed, so that the hydrophilic effect by the UV irradiation in the development treatment becomes small. Moreover, difficulty in unit manufacturing is extremely high and is not realistic. On the other hand, in the present embodiment, the oxidizing liquid 23 is supplied only to the back surface of the substrate 100, so that the hydrophilic treatment and development treatment starts can be performed simultaneously.

As the oxidizing liquid 23 (chemical), for example, ozone water, sulfuric acid, hydrogen peroxide solution, or nitric acid is used. The back surface treatment to the substrate 100 by the oxidizing liquid can be performed before any process so long as it is performed before the first liquid treatment to the substrate 100.

As above, according to the second embodiment, because the conductive film M is hydrophilized with the oxidizing liquid 23 before the development treatment process, contamination of the back surface of the EUV mask when manufacturing the EUV mask 200 can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing method comprising:
    exposing a mask substrate in which a first film having a first hydrophilicity is formed on one main surface and a resist is applied to another main surface as a mask substrate used for forming an EUV mask, from a side of the resist;
    performing a hydrophilic treatment on a surface of the first film to make the surface of the first film have a second hydrophilicity larger than the first hydrophilicity; and
    performing a development treatment of the resist with respect to the mask substrate in which the hydrophilic treatment is performed on the surface of the first film to have the second hydrophilicity.

2. The substrate processing method according to claim 1, wherein the performing the hydrophilic treatment on the surface of the first film includes performing the hydrophilic treatment to make the surface of the first film have the second hydrophilicity by irradiating the surface of the first film with UV light.

3. The substrate processing method according to claim 1, wherein the performing the hydrophilic treatment on the surface of the first film includes performing the hydrophilic treatment to make the surface of the first film have the second hydrophilicity by supplying an oxidizing liquid to the surface of the first film.

4. The substrate processing method according to claim 3, wherein
    the performing the development treatment includes supplying a developer to the resist, and
    the supplying the developer is performed at a same time as the supplying the oxidizing liquid to the surface of the first film performed in the hydrophilic treatment.

5. The substrate processing method according to claim 1, wherein the performing the hydrophilic treatment on the surface of the first film includes performing the hydrophilic treatment to make the surface of the first film have the second hydrophilicity so that a contact angle of the surface of the first film with respect to a rinse liquid becomes 5° or less.

6. The substrate processing method according to claim 2, further comprising pre-wetting the mask substrate by a liquid that does not react with the mask substrate before the performing the development treatment of the resist after the irradiating the surface of the first film with UV light.

7. The substrate processing method according to claim 2, wherein the performing the development treatment of the resist is performed within five minutes after the irradiating the surface of the first film with UV light.

8. A manufacturing method of EUV mask comprising:
    manufacturing an EUV mask by a substrate processing method including
        exposing a mask substrate in which a first film having a first hydrophilicity is formed on one main surface and a resist is applied to another main surface as a mask substrate used for forming the EUV mask, from a side of the resist, performing a hydrophilic treatment on a surface of the first film to make the surface of the first film have a second hydrophilicity larger than the first hydrophilicity, and performing a development treatment of the resist with respect to the mask substrate in which the hydrophilic treatment is performed on the surface of the first film to have the second hydrophilicity.

9. The method according to claim 8, wherein the performing the hydrophilic treatment on the surface of the first film includes performing the hydrophilic treatment to make the surface of the first film have the second hydrophilicity by irradiating the surface of the first film with UV light.

10. The method according to claim 8, wherein the performing the hydrophilic treatment on the surface of the first film includes performing the hydrophilic treatment to make the surface of the first film have the second hydrophilicity by supplying an oxidizing liquid to the surface of the first film.

11. The method according to claim 10, wherein
the performing the development treatment includes supplying a developer to the resist, and
the supplying the developer is performed at a same time as the supplying the oxidizing liquid to the surface of the first film performed in the hydrophilic treatment.

12. The method according to claim 8, wherein the performing the hydrophilic treatment on the surface of the first film includes performing the hydrophilic treatment to make the surface of the first film have the second hydrophilicity so that a contact angle of the surface of the first film with respect to a rinse liquid becomes 5° or less.

13. The method according to claim 9, further comprising pre-wetting the mask substrate by a liquid that does not react with the mask substrate before the performing the development treatment of the resist after the irradiating the surface of the first film with UV light.

14. The method according to claim 9, wherein the performing the development treatment of the resist is performed within five minutes after the irradiating the surface of the first film with UV light.

15. An EUV mask that is manufactured by a substrate processing method including
exposing a mask substrate in which a first film having a first hydrophilicity is formed on one main surface and a resist is applied to another main surface as a mask substrate used for forming the EUV mask, from a side of the resist,
performing a hydrophilic treatment on a surface of the first film to make the surface of the first film have a second hydrophilicity larger than the first hydrophilicity, and
performing a development treatment of the resist with respect to the mask substrate in which the hydrophilic treatment is performed on the surface of the first film to have the second hydrophilicity.

16. The EUV mask according to claim 15, wherein when performing the hydrophilic treatment on the surface of the first film, the hydrophilic treatment is performed to make the surface of the first film have the second hydrophilicity by irradiating the surface of the first film with UV light.

17. The EUV mask according to claim 15, wherein when performing the hydrophilic treatment on the surface of the first film, the hydrophilic treatment is performed to make the surface of the first film have the second hydrophilicity by supplying an oxidizing liquid to the surface of the first film.

18. The EUV mask according to claim 17, wherein supply of a developer to the resist performed in the development treatment is performed at a same time as supply of the oxidizing liquid to the surface of the first film performed in the hydrophilic treatment.

19. The EUV mask according to claim 15, wherein when performing the hydrophilic treatment on the surface of the first film, the hydrophilic treatment is performed to make the surface of the first film have the second hydrophilicity so that a contact angle of the surface of the first film with respect to a rinse liquid becomes 5° or less.

20. The EUV mask according to claim 16, wherein the mask substrate is pre-wet by a liquid that does not react with the mask substrate before performing the development treatment of the resist after irradiating the surface of the first film with UV light.

* * * * *